United States Patent
Noguchi et al.

(10) Patent No.: US 7,180,240 B2
(45) Date of Patent: Feb. 20, 2007

(54) WHITE LIGHT EMITTING DEVICE HAVING CORRECTED DISTRIBUTIONS OF CHROMATICITY AND LUMINANCE

(75) Inventors: Katsuhiko Noguchi, Yamanashi-ken (JP); Megumi Horiuchi, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 217 days.

(21) Appl. No.: 10/679,490

(22) Filed: Oct. 7, 2003

(65) Prior Publication Data

US 2004/0070338 A1 Apr. 15, 2004

(30) Foreign Application Priority Data

Oct. 7, 2002 (JP) .............................. 2002-294326

(51) Int. Cl.
*H01L 33/00* (2006.01)
*H01J 1/62* (2006.01)

(52) U.S. Cl. .................. 313/512; 313/498; 313/501; 313/503; 257/100; 257/89; 257/99

(58) Field of Classification Search ................ 313/512; 257/92
See application file for complete search history.

(56) References Cited

U.S. PATENT DOCUMENTS

| | | | |
|---|---|---|---|
| 5,959,316 A * | 9/1999 | Lowery | 257/98 |
| 6,184,544 B1 | 2/2001 | Hidekazu et al. | |
| 6,319,425 B1 | 11/2001 | Tasaki et al. | |
| 6,576,930 B2 * | 6/2003 | Reeh et al. | 257/98 |
| 6,576,931 B2 * | 6/2003 | Furukawa et al. | 257/98 |
| 6,657,382 B2 * | 12/2003 | Nagai et al. | 313/512 |
| 6,828,590 B2 * | 12/2004 | Hsiung | 257/79 |
| 6,841,933 B2 * | 1/2005 | Yamanaka et al. | 313/512 |
| 6,858,880 B2 * | 2/2005 | Horiuchi et al. | 257/100 |
| 6,917,057 B2 * | 7/2005 | Stokes et al. | 257/98 |
| 6,936,857 B2 * | 8/2005 | Doxsee et al. | 257/89 |
| 7,019,335 B2 * | 3/2006 | Suenaga | 257/99 |
| 2002/0139990 A1 | 10/2002 | Yoshinobu et al. | |
| 2003/0102481 A1 | 6/2003 | Isoda | |
| 2003/0141563 A1 * | 7/2003 | Wang | 257/432 |

FOREIGN PATENT DOCUMENTS

| | | |
|---|---|---|
| EP | 1081771 | 3/2001 |
| EP | 1187226 | 2/2002 |
| JP | 11-163417 | 6/1999 |
| JP | 2002-043625 | 2/2002 |
| JP | 2002-289925 | 10/2002 |
| JP | 2003163378 A * | 6/2003 |
| KR | 1999-0087020 | 12/1999 |
| KR | 2000-0022539 | 4/2000 |

* cited by examiner

*Primary Examiner*—Sikha Roy
(74) *Attorney, Agent, or Firm*—Dennison, Schultz & MacDonald

(57) ABSTRACT

A blue light emitting element is mounted on a bottom of a case body. A cover member covers the blue light emitting element. Fluorescent material is mixed in the cover member for converting wavelength of light emitted from the blue light emitting element to adjust chromaticity of the light, and luminance reducing material for adjusting the luminance of the light is mixed in the cover member.

11 Claims, 15 Drawing Sheets

WHITE LIGHT EMITTING DEVICE HAVING CORRECTED DISTRIBUTIONS OF CHROMATICITY AND LUMINANCE

BACKGROUND OF THE INVENTION

The present invention relates to a white light emitting device.

Figure 25:
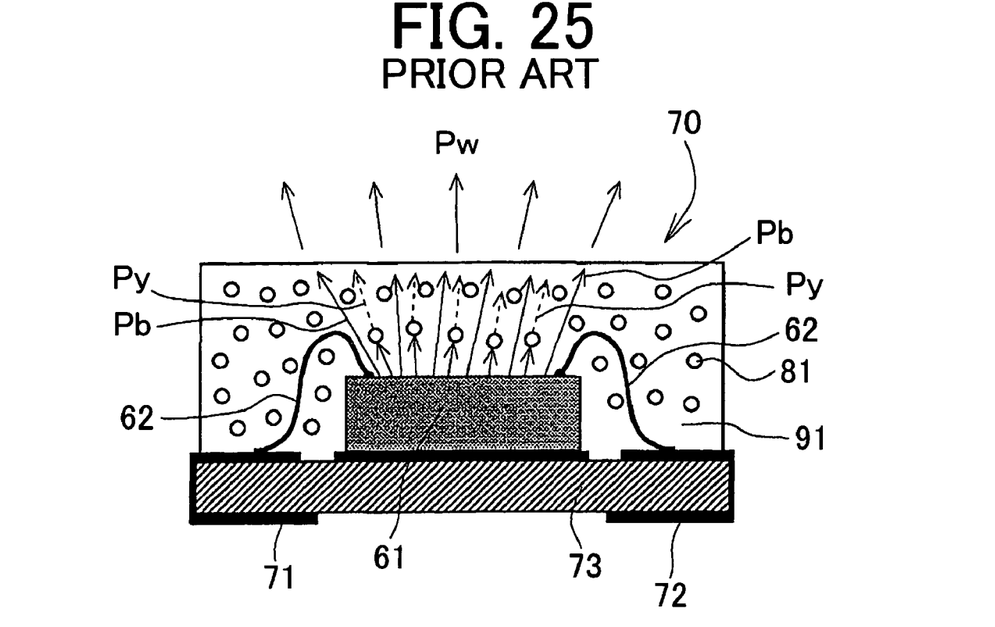
FIG. 25 is a sectional view of a conventional LED device disclosed in U.S. Pat. No. 6,069,440.

FIG. 25 is a sectional view of a conventional LED device disclosed in U.S. Pat. No. 6,069,440. The white LED device 70 comprises a substrate 73, electrodes 71 and 72 secured to the substrate 73 and a blue LED 61 mounted on the substrate 73. The LED 61 is connected to the electrodes 71 and 72 by lead wires 62. The LED 61 and electrodes 71, 72 are encapsulated with a transparent encapsulating resin 91.

In the resin 91, fluorescent materials of YAG group are mixed. The fluorescent material comprises phosphor particles 81.

When the current is applied to the blue LED 61 via electrodes 71 and 72, the LED emits blue light Pb. When a portion of the blue light impinges upon the phosphor particle, the phosphor particle absorbs the blue light and emits yellow light Py. When the yellow light Py and the blue light Pb are combined, white light Pw is created.

Furthermore, U.S. Pat. No. 6,319,425 discloses an LED covered by a cap in which fluorescent material is included.

Further, U.S. Pat. No. 6,351,069 discloses an LED encapsulated by a transparent resin in which two kinds of phosphor particles are included, thereby producing white light.

However, since the LED is a compound semiconductor, there is wide variation in chromaticity and luminance of products. Further, the chromaticity and luminance of the mixed white light Pw also vary widely because of difference of quantity and distribution of the phosphor particles in the encapsulating resin.

Figure 26:
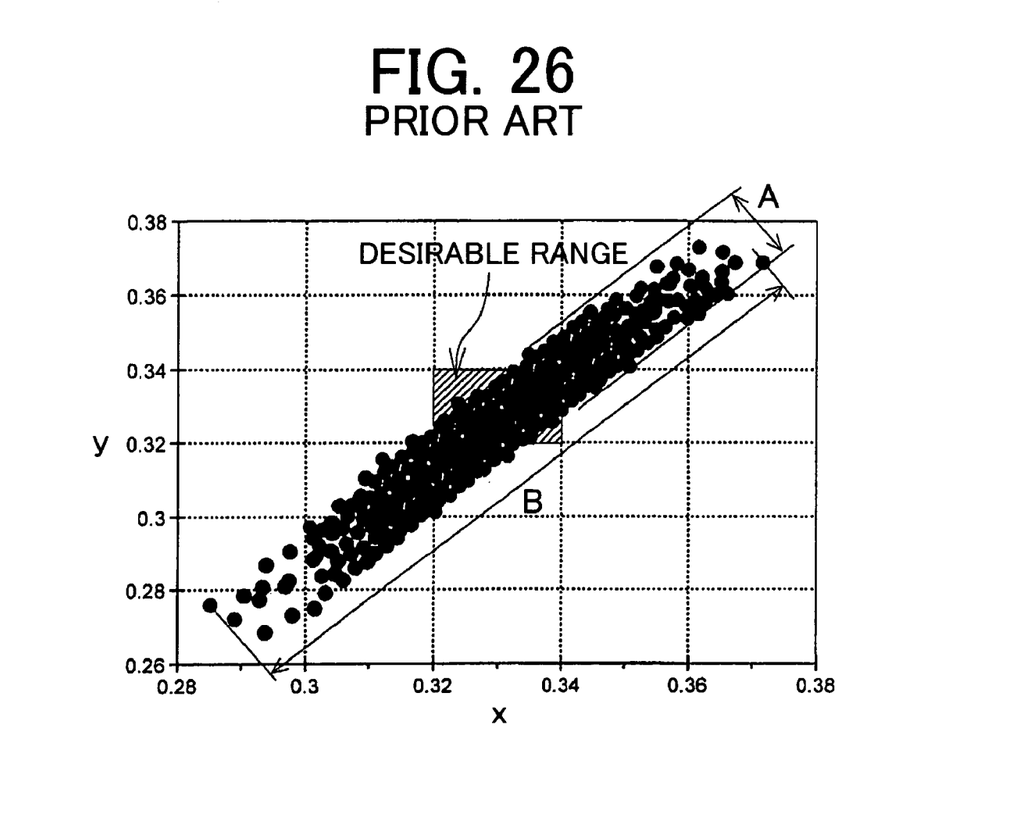
FIGS. 26 and 27 are graphs showing dispersion in chromaticity and luminance of LED devices.
Figure 27:
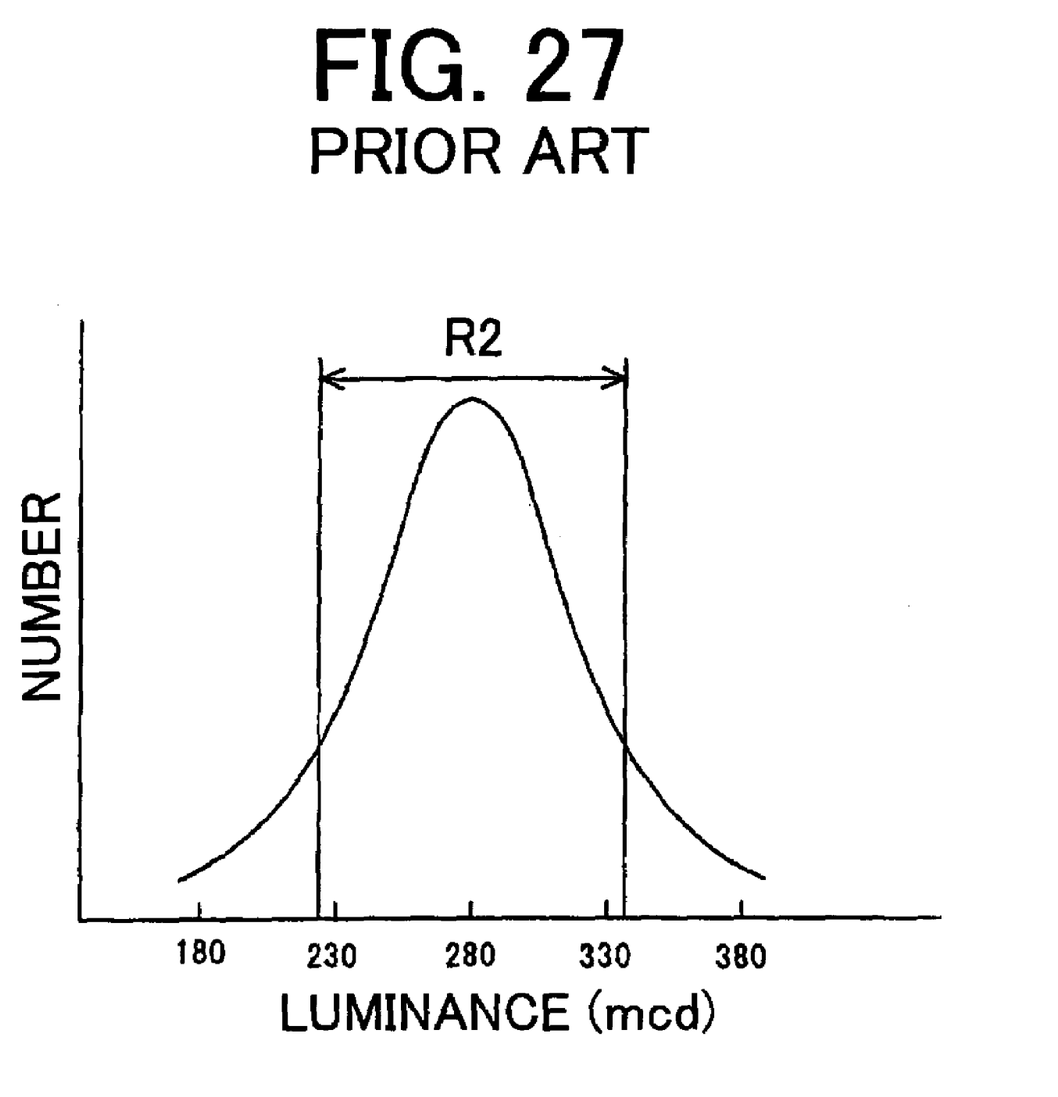

FIGS. 26 and 27 are graphs showing numeric data widely varied in chromaticity and luminance of LED devices.

FIG. 26 is a graph of XYZ chromaticity coordinates showing variation in chromaticity of LED devices by 1 lot mass production. Each black point indicates the chromaticity of an LED device. The variation is in an upward zonal arrangement. Here, the dispersion of the black points in the width direction shown by the letter A means the variation of chromaticity of the blue LED, the dispersion in the longitudinal direction shown by the letter B means the variation of quantity and distribution of the phosphor particles in the encapsulating resin.

An LED device having chromaticity which is largely deviated from a central value in FIG. 26 can not be used as a device for emitting white light. It is frequently desirable that the LED device has chromaticity in a central range shown by hatching where X and Y are in a range of 0.33±0.01.

In the graph of FIG. 27, the horizontal axis shows luminance and the vertical axis shows the number of LED devices. The luminance variation is distributed in +30% to −40% range from the center of the distribution. However, a desirable range R2 is about ±20% as shown by arrows in FIG. 27.

SUMMARY OF THE INVENTION

An object of the present invention is to provide a white light emitting device which may correct distributions of the chromaticity and luminance in a desired range.

According to the present invention, there is provided a white light emitting device comprising a blue light emitting element, a cover member for covering the blue light emitting element, fluorescent material being mixed in the cover member for converting wavelength of light emitted from the blue light emitting element to adjust chromaticity of the light, and luminance reducing material being mixed in the cover member for adjusting the luminance of the light.

The luminance reducing material is pigment or dye for reducing the luminance irrespective of the wavelength of the light emitting from the light emitting element.

The cover member is formed with elastomer of silicon group in which the fluorescent material and the luminance reducing material are mixed.

The present invention further provides a white light emitting device comprising a case body having a recess forming a reflection face, a blue light emitting element mounted on a bottom of the recess, a cover member including fluorescent material and covering a light emitting face of the case body, fluorescent material being mixed in the cover member for converting wavelength of light emitted from the blue light emitting element to adjust chromaticity of the light, and luminance reducing material being mixed in the cover member for adjusting the luminance of the light.

In an aspect of the invention, the white light emitting device further comprises a cover member holding portion formed in the recess of the case body, the cover member being mounted on the cover member holding portion.

The recess is formed into a cup shape having an inclination surface open to a light emitting direction, the cover member has an inclined peripheral wall so as to be engaged with the inclination surface.

In another aspect of the invention, the white light emitting device further comprises a shoulder formed in the recess of the case body for holding the cover member.

The blue light emitting element is mounted on the bottom of the recess by face down bonding.

The blue light emitting element is mounted on a substrate by face down bonding to form a light emitting unit, and the substrate is mounted on the bottom of the recess.

The blue light emitting element is an LED of InGaN group.

The fluorescent material is a fluorescent material of YAG group.

The luminance reducing material is a pigment of black.

The present invention also provides a white light emitting device comprising, a case body having a recess forming a reflection face, a blue light emitting element mounted on a bottom of the recess, a cover member including fluorescent material and covering a light emitting face of the case body, the case body comprising a pair of metal cores which are opposed to each other interposing an insulation member, the surface of each of the metal cores being coated with a metal plating having high reflectance, fluorescent material for converting wavelength of light emitted from the blue light emitting element to adjust chromaticity of the light, and luminance reducing material for adjusting the luminance of the light being mixed in the cover member.

The metal case is made of a magnesium alloy, the surface of the metal core is coated with silver plating.

The cover member has arms, the arms are engaged with grooves formed in the case body.

A projection is formed on the arm of the cover member, the projection is engaged with an engaging hole formed in the groove of the case body.

The cover member is provided by separating from a cover member assembly comprising a plurality of cover members which are connected by arms.

These and other objects and features of the present invention will become more apparent from the following detailed description with reference to the accompanying drawings.

DETAILED DESCRIPTION OF THE PREFERRED EMBODIMENT

Figure 1:
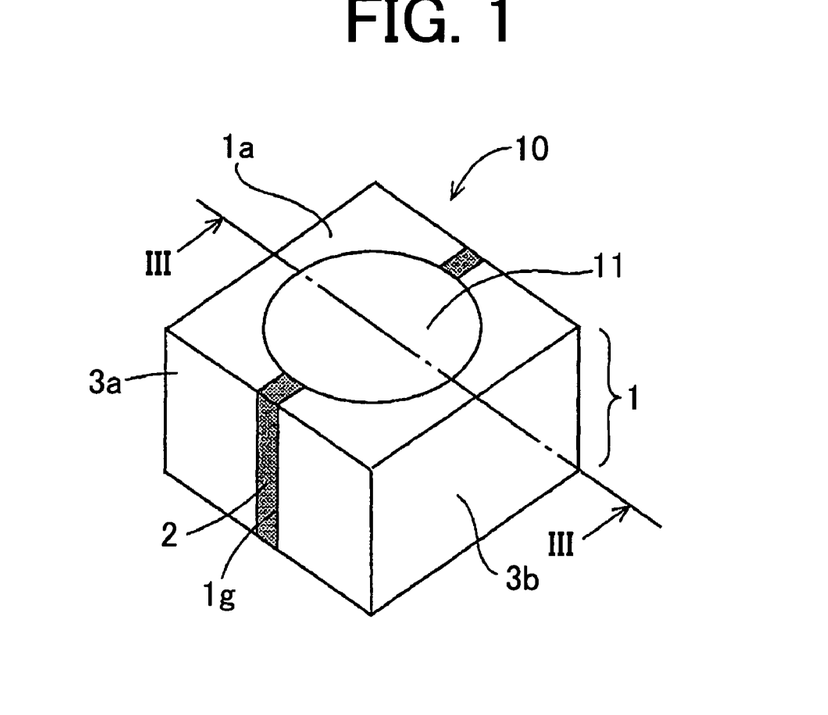
FIG. 1 is a perspective view of a white light emitting device according to a first embodiment of the present invention.
Figure 2:
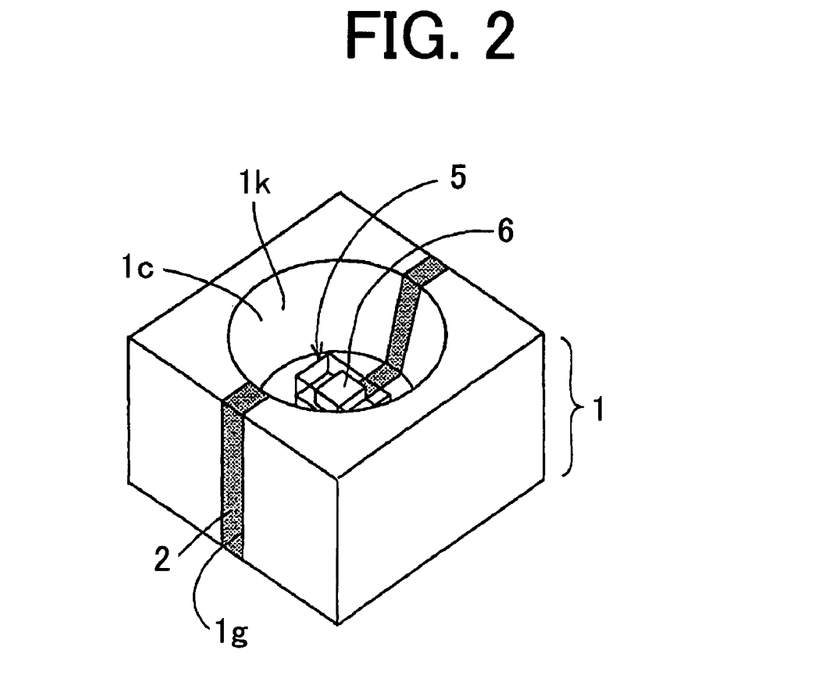
FIG. 2 is a perspective view of the white light emitting device in which a cover member in FIG. 1 is removed.
Figure 3:
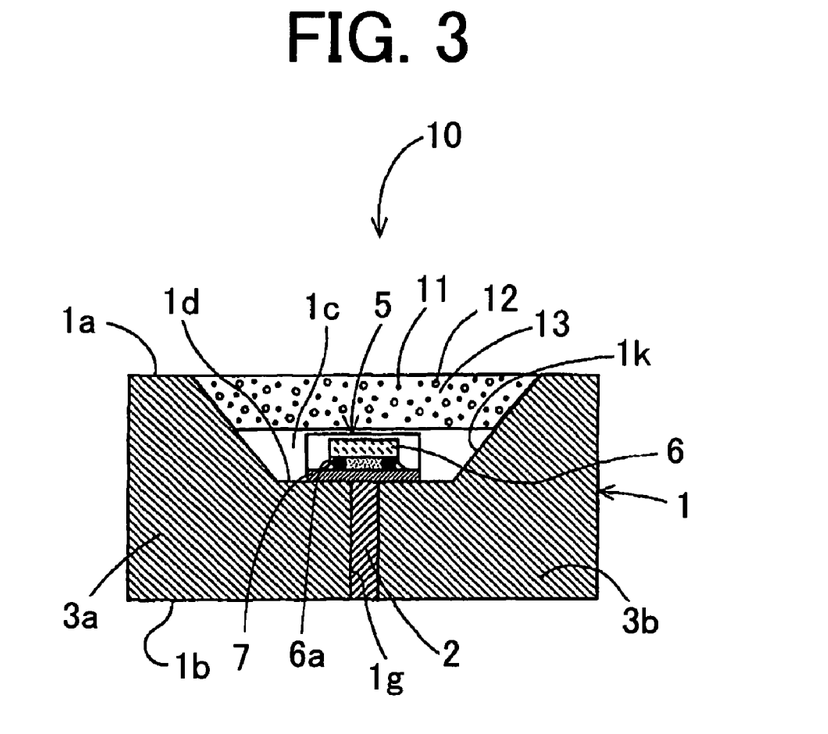
FIG. 3 is a sectional view of the white light emitting device taken along a line III—III of FIG. 1.
Figure 4:
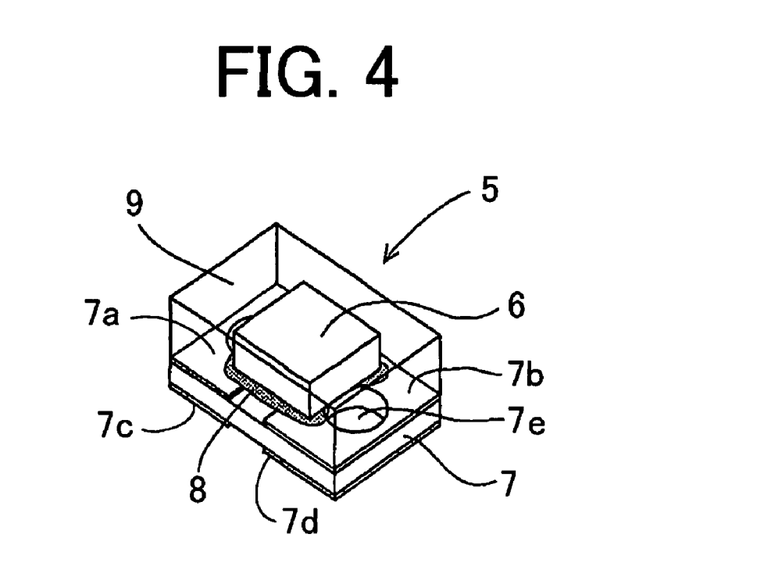
FIG. 4 is a perspective view of a light emitting unit.

FIG. 1 is a perspective view of a white light emitting device according to a first embodiment of the present invention, FIG. 2 is a perspective view of the white light emitting device in which a cover member in FIG. 1 is removed, FIG. 3 is a sectional view of the white light emitting device taken along a line III—III of FIG. 1, and FIG. 4 is a perspective view of a light emitting element unit.

Referring to FIGS. 1 to 3, a white light emitting LED device 10 comprises a cubic case 1 made of moldable metal having a high heat conductivity such as Mg group and formed by injection molding, and having a recess 1c of an inverted truncated cone and having an inclined inside wall 1k. The case 1 comprises a pair of first and second half metal cores 3a and 3b, interposing an insulation layer 2 which is made of resin and charged in a slit 1g. The inside wall of the recess 1c and an upper surface 1a of the case 1c are processed into a light reflection surface by silver plating.

Referring to FIG. 4, a light emitting element unit 5 comprises a blue LED 6 of InGaN group, a substrate 7 made of ceramics and having upper electrodes 7a and 7b and lower electrodes 7c and 7d. The upper and lower electrodes 7a and 7c, and the upper and lower electrodes 7b and 7d are electrically connected with each other by a pair of through-holes 7e, thereby forming a pair of wiring patterns. A pair of bumps 6a (FIG. 3) are secured to a pair of electrodes (not shown) on the underside of the LED 6. The blue LED 6 as a light emitting element is mounted on the upper electrodes 7a, 7b through bumps 6a by face down bonding. The underside of the LED 6 is encapsulated by a resin 8 to protect the bumps 6a. Further, the LED 6 is encapsulated by a resin 9. The light emitting element unit 5 is mounted on the bottom of the recess 1c by soldering the lower electrodes 7c, 7d to the metal cores 3a, 3b.

A cover member 11 made of transparent resin such as elastomer of silicon group has an outside shape so as to engage with the inclined wall 1k of the empty recess 1c, and is spaced from the bottom of recess 1c. If required, the cover member 11 is secured to the recess 1c by caulking or an adhesive. In the cover member 11, YAG phosphor particles 12 and a luminance reducing material particles 13 such as pigment and dye particles 7f are mixed. The phosphor particle 12 and the pigment particle 13 are selected so that the chromaticity and luminance of the light emitted from the LED 6 are corrected to desired values.

As the phosphor particle is selected from fluorescent materials of YAG group where the ratio of Ga to Gd is variously changed.

As the luminance reducing material, pigments of black group in which graphite and carbon or red, green and blue pigments are mixed are used.

In operation, when the current is applied to the metal cores 3a and 3b, the current is applied to the blue LED 6 via the electrodes 7a, 7b, 7c, 7d and bumps 6a. Thus the LED 6 is excited to emit blue light. When a part of the blue light impinges upon the phosphor particle 12, the blue light is absorbed in the phosphor particle 12 and the particle emits yellow light. When the yellow light and the blue light which does not impinge upon the phosphor particle are mixed, white light produces. Further, the chromaticity and luminance of the white light are corrected to desired chromaticity and luminance by the phosphor particles 12 and pigment particles 13.

Since the case 1 is made of a metal having a high heat conductivity, the case is superior in heat radiation. Therefore, the LED device can effectively be used for a light emitting device in which the case temperature rises highly because of a large current.

There is provided the cover member 11 in which the phosphor particles 12 and the luminance reducing particles 13 are mixed. A white light emitting device 1 satisfies both of the chromaticity and luminance in a desired range, thereby reducing the variation in characteristics. Since the luminance reducing member is used, initial luminance can be set to a large value, so that the luminance is adjusted by reducing the luminance. Therefore, luminance can be adjusted in a wide range.

Since the cover member 11 is made of the elastomer of silicon group, the phosphor particles 12 and the luminance reducing particles 13 are uniformly distributed in the cover member without depositing and biasing. Therefore, the LED device emits light uniform in chromaticity and luminance.

Figure 5:
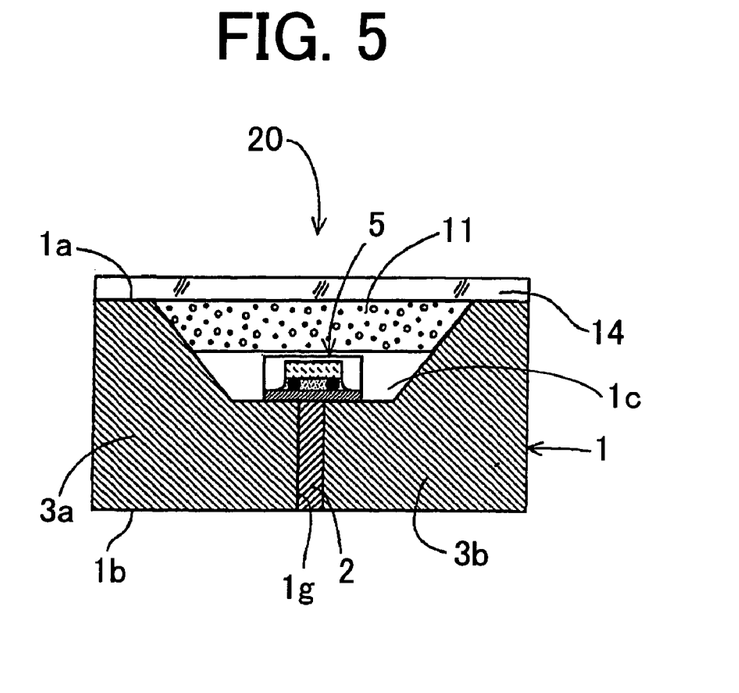
FIG. 5 is a sectional view showing a white light emitting device according to a second embodiment of the present invention.

FIG. 5 is a sectional view showing a white light emitting device according to a second embodiment of the present invention. The white light emitting device 20 has the case 1 same as that of the first embodiment. A cover plate 14 made of glass or transparent solid plastic such as acrylic resin and silicon is secured to the upper surface 1a to press the cover member 11 against the inside wall of the recess 1c. Other parts are identified by the same reference numerals as FIG. 3.

Since the cover member 11 is held by the cover plate 14, it is not necessary to adhere the cover member 11 to the wall of the recess 1k.

Figure 6:
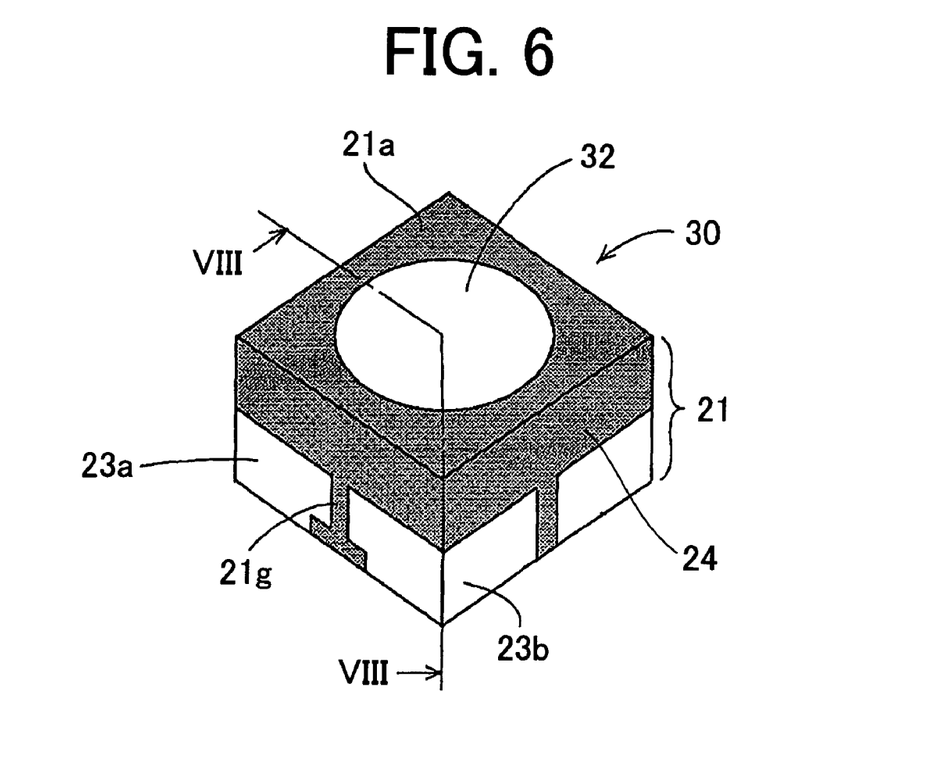
FIG. 6 is a perspective view showing a white light emitting device according to a third embodiment of the present invention.
Figure 7:
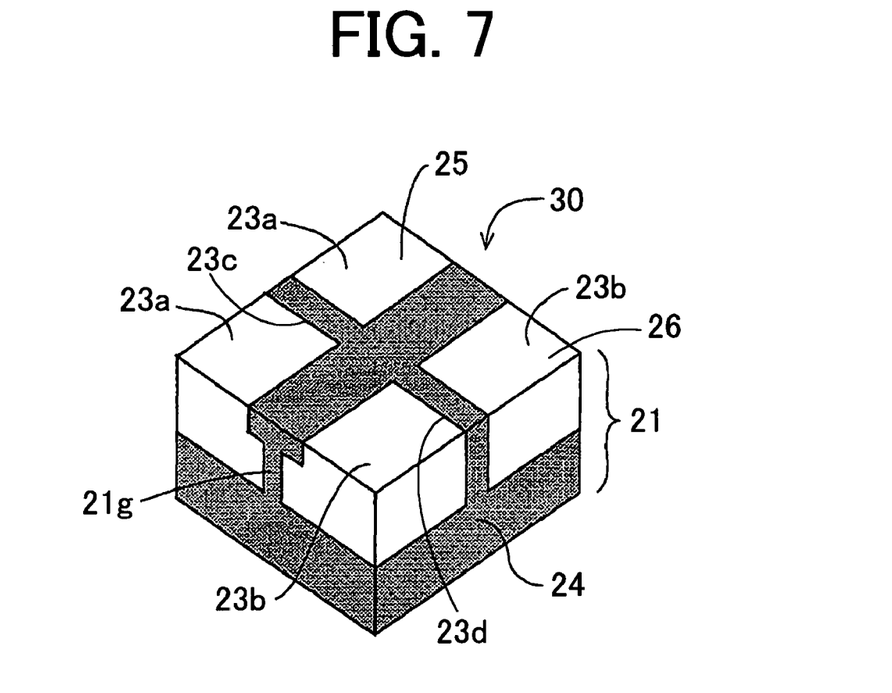
FIG. 7 is a perspective view of the white light emitting device as viewed from a reverse side thereof.
Figure 8:
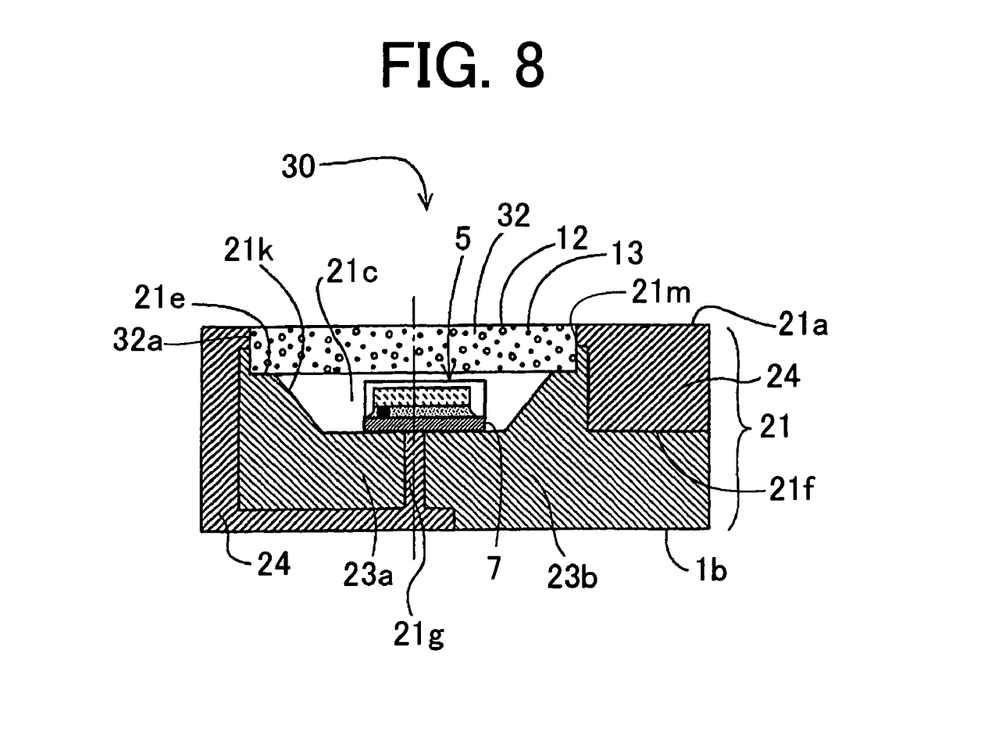
FIG. 8 is a sectional view taken along a line VIII—VIII of FIG. 6.

FIG. 6 is a perspective view showing a white light emitting device according to a third embodiment of the present invention. FIG. 7 is a perspective view of the white light emitting device as viewed from a reverse side thereof, FIG. 8 is a sectional view taken along a line VIII—VIII of FIG. 6.

Referring to FIGS. 6 and 7, the white light emitting device 30 comprises a case 21 having a cubic shape. The case 21 comprises a pair of metal cores 23a and 23b made of metal having a high heat conductivity, and a combining resin 24 of heat resistivity. The combining resin 24 is mounted on a step 21f of the case 21 to form an upper shape of the case, charged in a slit 21g between the metal cores 23a and 23b, and in grooves 23c and 23d formed in the side wall and the underside of the metal cores 23a and 23b, thereby combining the metal cores.

The undersides of the metal cores 23a and 23b form a pair of electrodes 25 and 26. A recess 21c is formed in the metal cores 23a and 23b. The inside wall of the recess 21c and the surfaces of the metal cores 23a and 23b are processed into light reflection surfaces by silver plating. A shoulder 21e is formed in an upper portion of the recess 21c, and a cover member 32 is mounted on the shoulder. Other parts are the same as the first embodiment and identified by the same reference numerals as the first embodiment.

Figure 9:
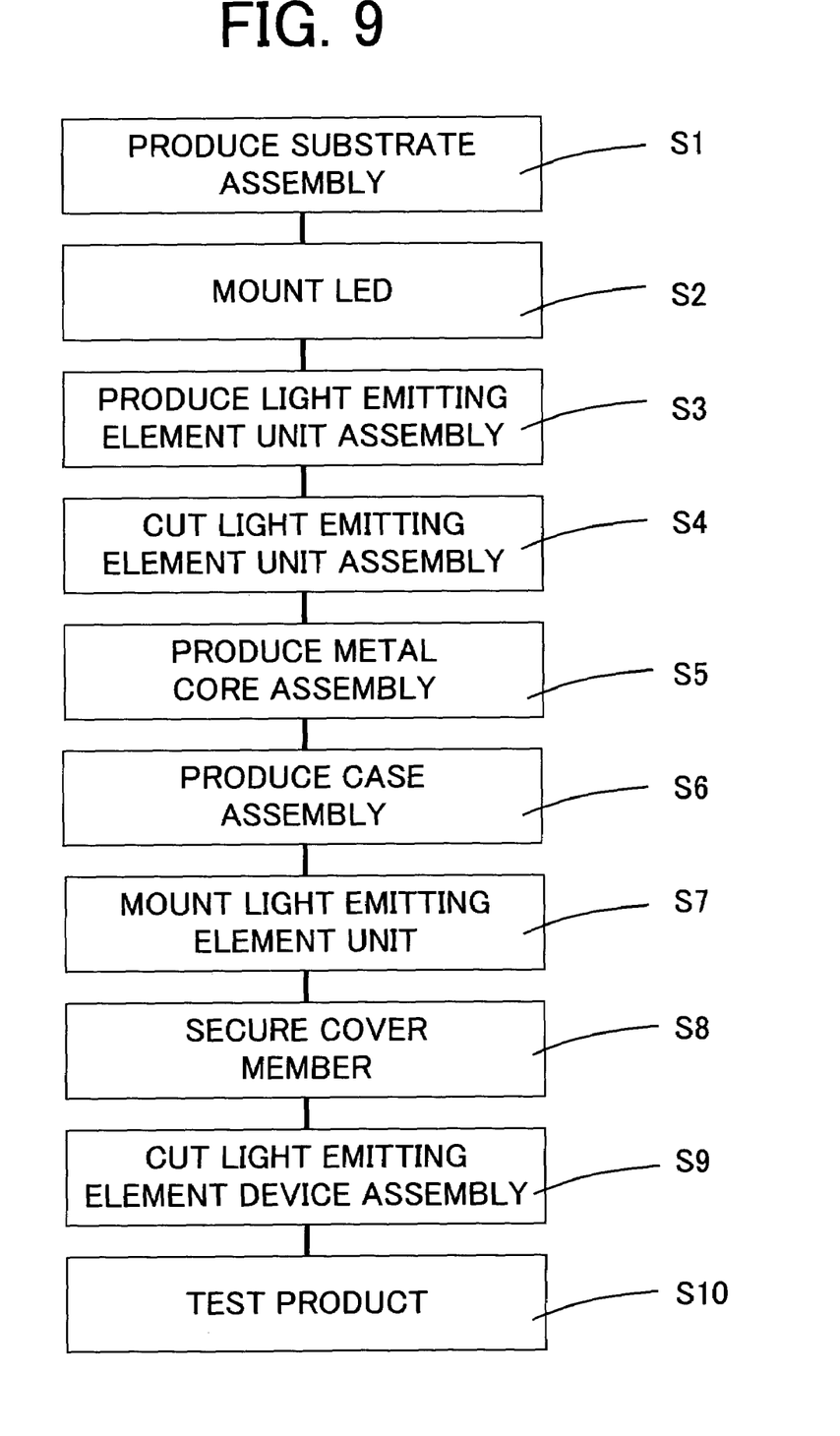
FIG. 9 is a flowchart showing the steps for manufacturing the third embodiment.

FIG. 9 is a flowchart showing the steps for manufacturing the third embodiment, and FIGS. 10~18 are perspective views showing the steps, whereby a plurality of light emitting element devices are manufactured at the same time.

At a step S1, a substrate assembly for a light emitting element unit is manufactured.

Figure 10:
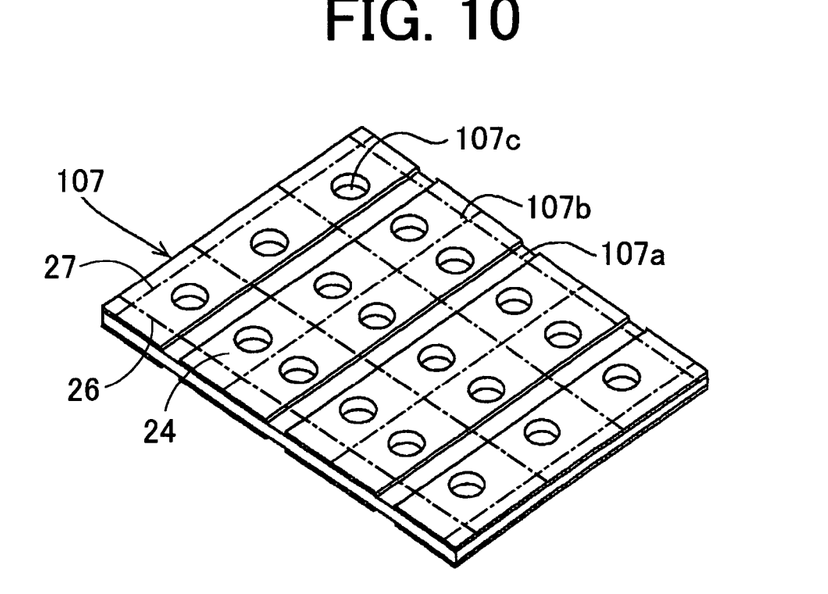
FIGS. 10, 11, 12, 13a and 13b are perspective views for explaining a method for manufacturing a light emitting element unit assembly.

FIG. 10 is a perspective view of a substrate assembly 107.

The substrate assembly 107 is divided into nine areas 24 for nine LED devices by dicing lines 26 and 27. On the upper surface and the underside of a substrate material, four sets of electrodes 107b are secured.

In each area, a pair of through-holes 107c are formed to electrically connect the upper and lower electrodes 107b.

Figure 11:
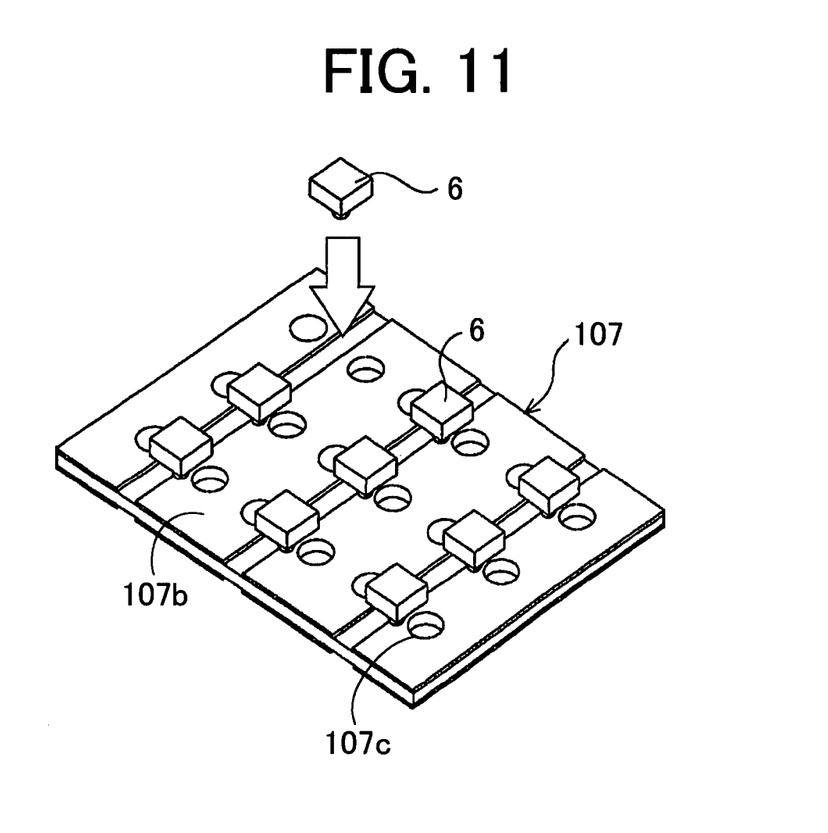
Figure 12:
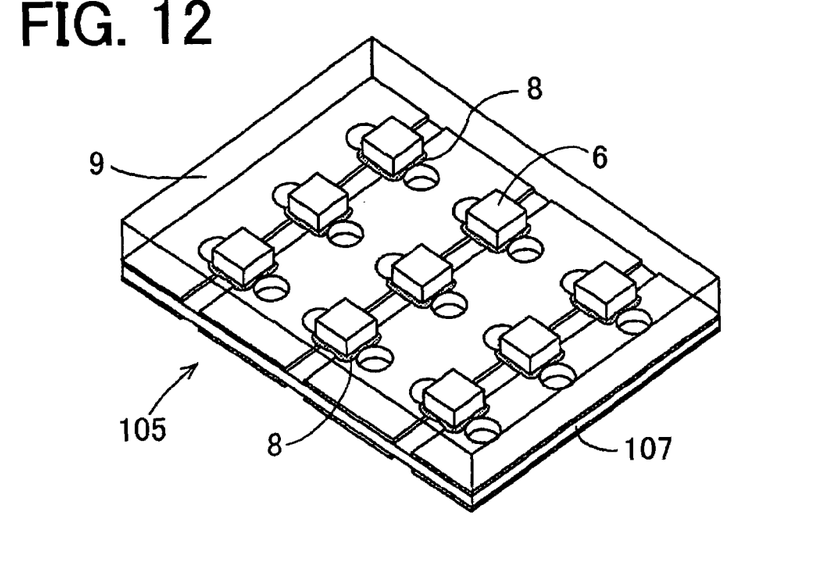

At a step S2, the blue LED 6 is mounted on the upper electrodes 107b through bumps (not shown) as shown in FIG. 11. Further, at a step S3, the underside of the LED 6 is encapsulated by the resin 8 and encapsulating resin 9 to form a light emitting element unit assembly 105 as shown in FIG. 12.

Figure 13A:
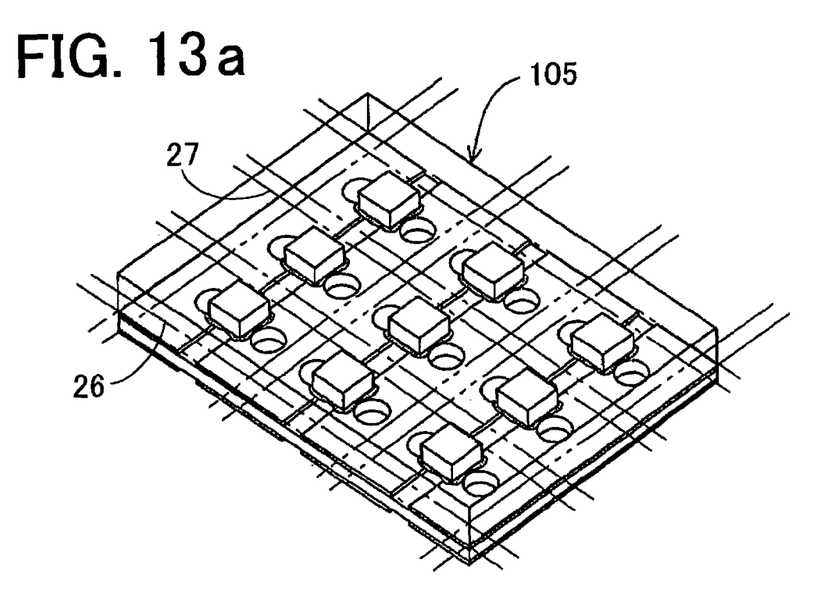
Figure 13B:
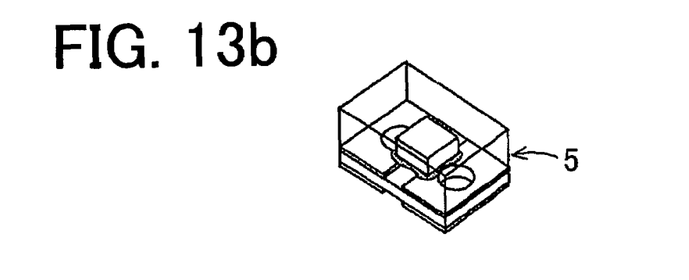

Next, at a step S4, the light emitting element unit assembly 105 is cut off along the dicing lines 26 and 27 to produce the light emitting element unit 5 from the assembly 105 as shown in FIG. 13b.

The chromaticity and luminance of each of the produced lighting element units are measured. The measured units are classified into ranks dependent on the result of the measurement.

Figure 14:
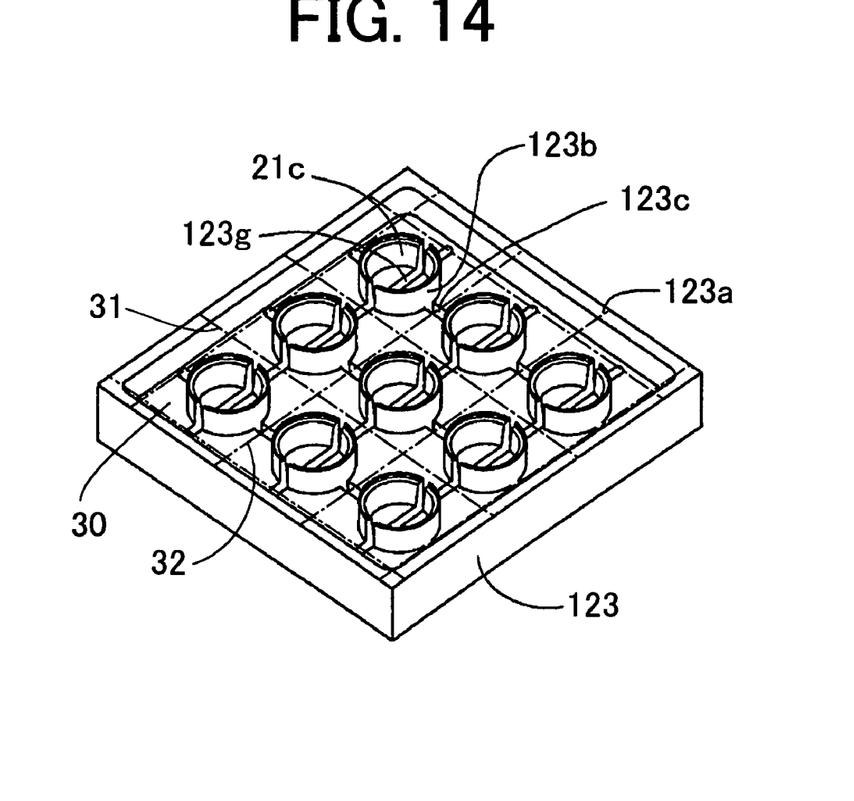
FIG. 14 is a perspective view of a metal core assembly.

Next, at a step S5, a metal core assembly is manufactured. As shown in FIG. 14, a metal core assembly 123 is formed by injection molding and divided into nine areas 30 for nine units 5 by dicing lines 31 and 32. A cylindrical portion 123b having recess 21c is formed in each area 30 at a central portion. Three slits 123g are formed in parallel to the lines 32 except a peripheral frame 123a.

Further, three grooves 123c are formed.

Figure 15:
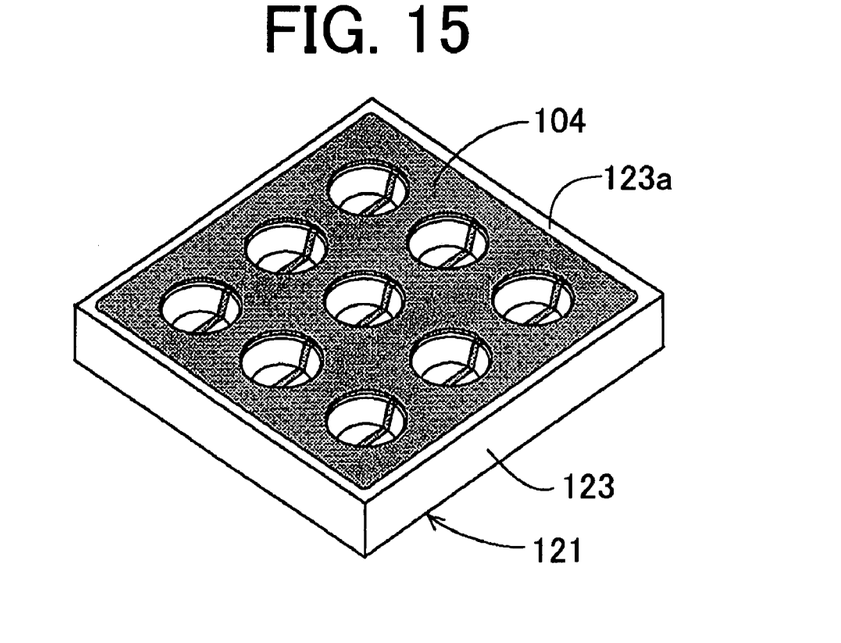
FIGS. 15, 16, 17 and 18 are perspective views for explaining a method for manufacturing a light emitting device.

At a step S6, a resin is charged in a recess within the peripheral frame 123a, slits 123g and grooves 123c to form a resin layer 104 as shown in FIG. 15. Thus, a case assembly 121 is produced.

Figure 16:
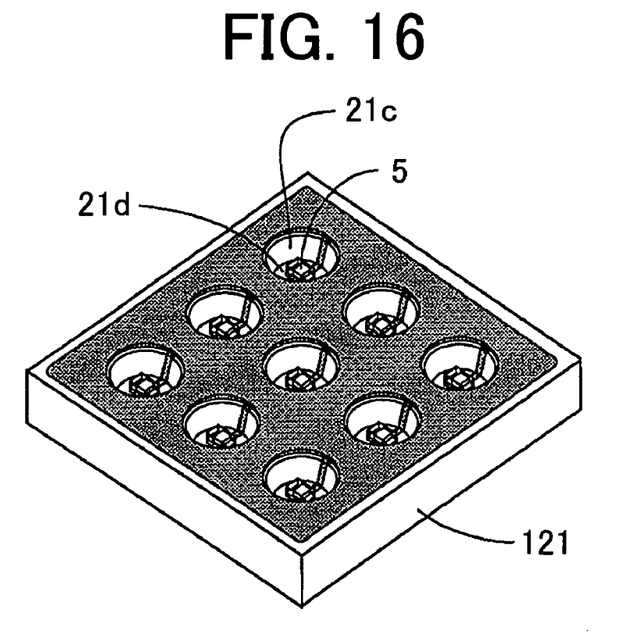

Next, at a step S7, light emitting element units 5 belonging to the same class are mounted on bottoms 21d of recesses 21c as shown in FIG. 16.

Figure 17:
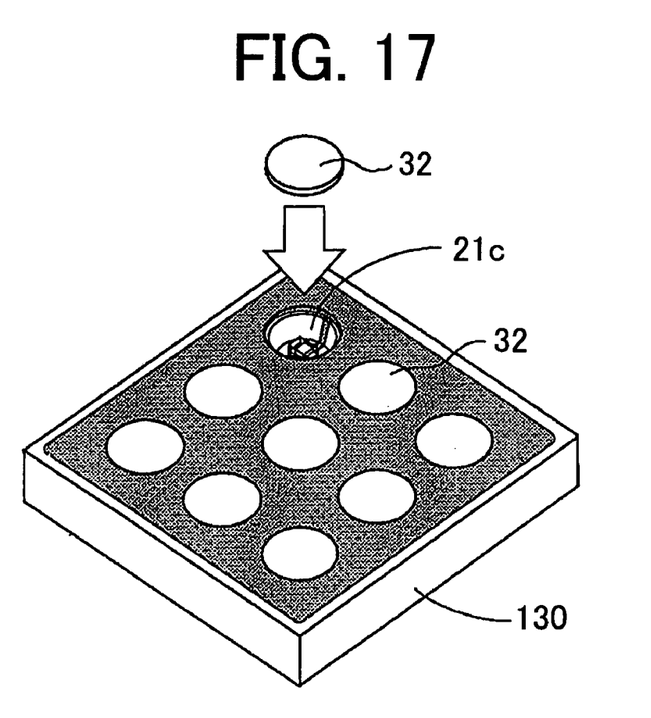

At a step S8, cover members 32 belonging to the same rank are secured to the inside wall of the recesses 21c, respectively, to form a light emitting element device assembly 130 as shown in FIG. 17.

Figure 18:
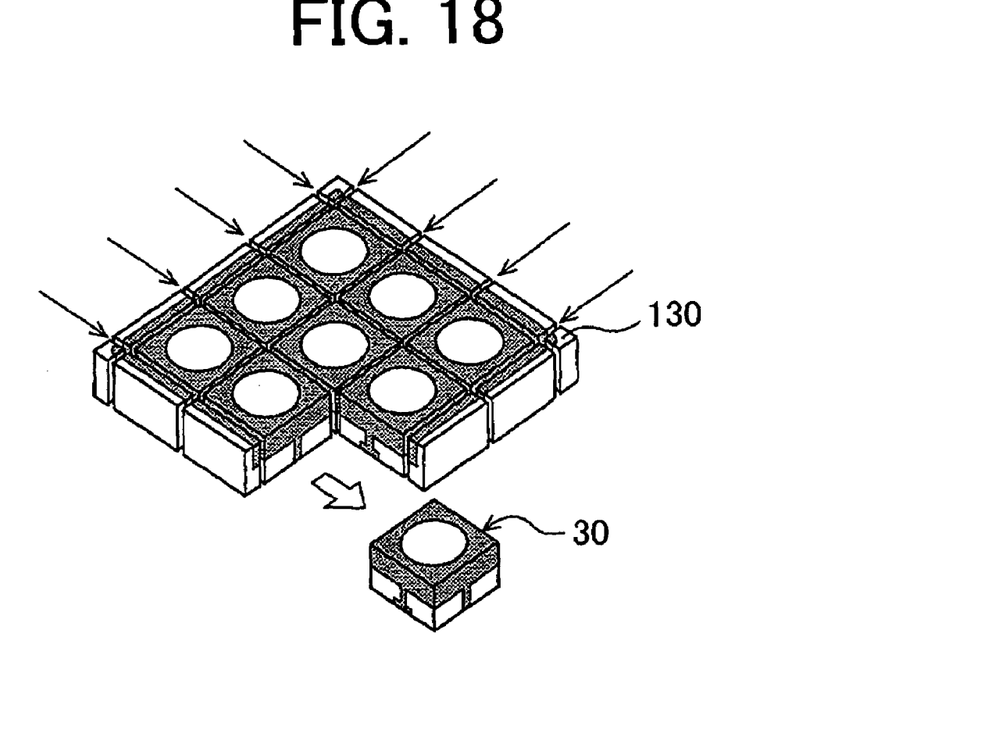

At a step S9, the assembly 130 is cut off along the dicing lines 31 and 32 to separate the independent light emitting device 30 as shown in FIG. 18.

Finally, at a step S10, the test of the product is carried out.

Figure 19:
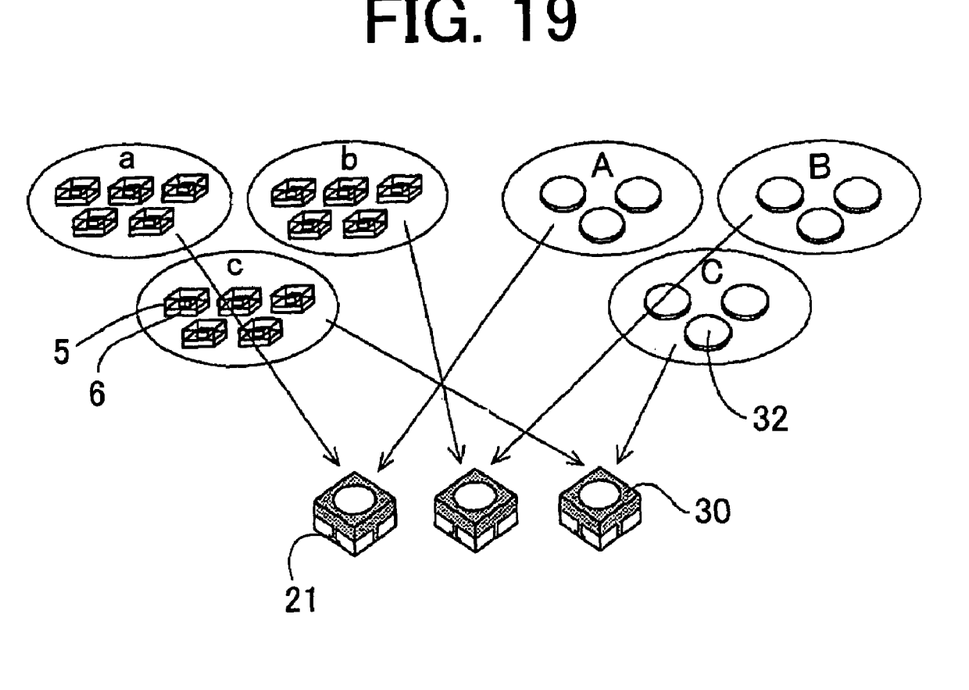
FIG. 19 is a perspective view showing a method for combining a light emitting element unit and a cover member.

FIG. 19 is a perspective view showing a method for combining a blue light emitting element unit and a cover member.

A method for combining the blue light emitting element 6 and the cover member 32 is described hereinafter with reference to FIG. 19.

The blue LED 6 in the unit 5 is measured about the chromaticity and the luminance by an LED tester, and measured LEDs are classified into classes, for example classes a, b, c, in accordance with the measured characteristics.

On the other hand, the cover members 32 are also classified into classes A, B and C so that the combinations a and A, b and B, c and C perform to emit desirable white lights. The combined sets are mounted in the case 21. Thus, white light emitting devices 30 are produced.

In accordance with the third embodiment, since the shoulder 21e is formed in the recess 21c, the cover member 32 can easily be set in the recess. On the inside wall of the recess 21c, the vertical wall 21m is formed, and the side wall 32a of the cover member 32 is accordingly vertical. Therefore, when the cover member is set in the recess 21c, it is not necessary to judge the distinction of both sides of the cover member.

Figure 20:
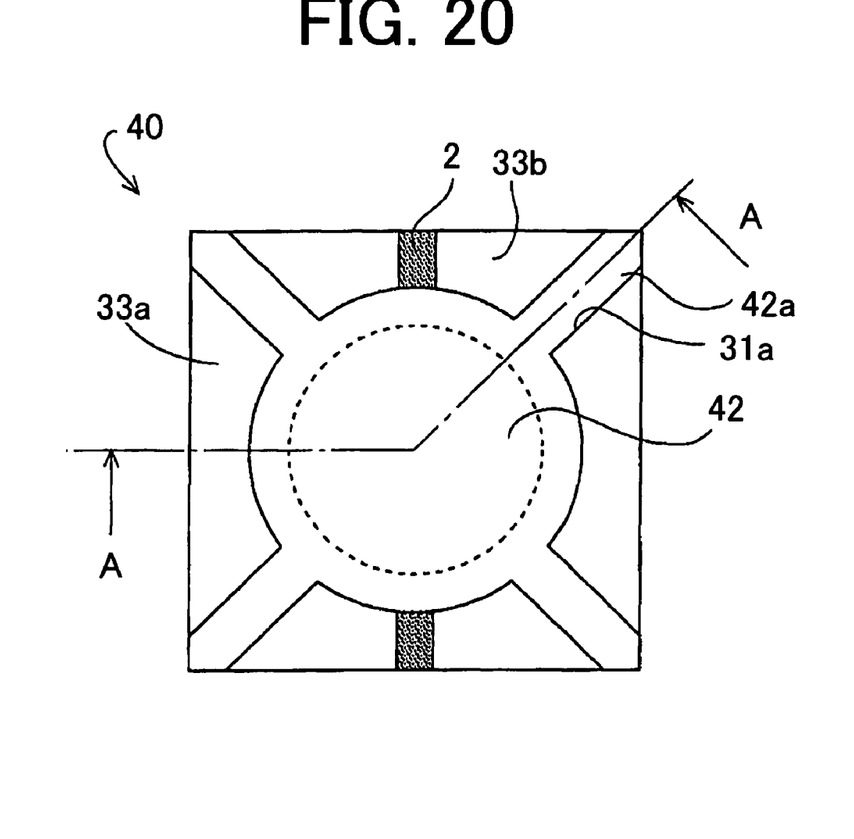
FIG. 20 is a plan view showing a white light emitting device according to a fourth embodiment of the present invention.
Figure 21:
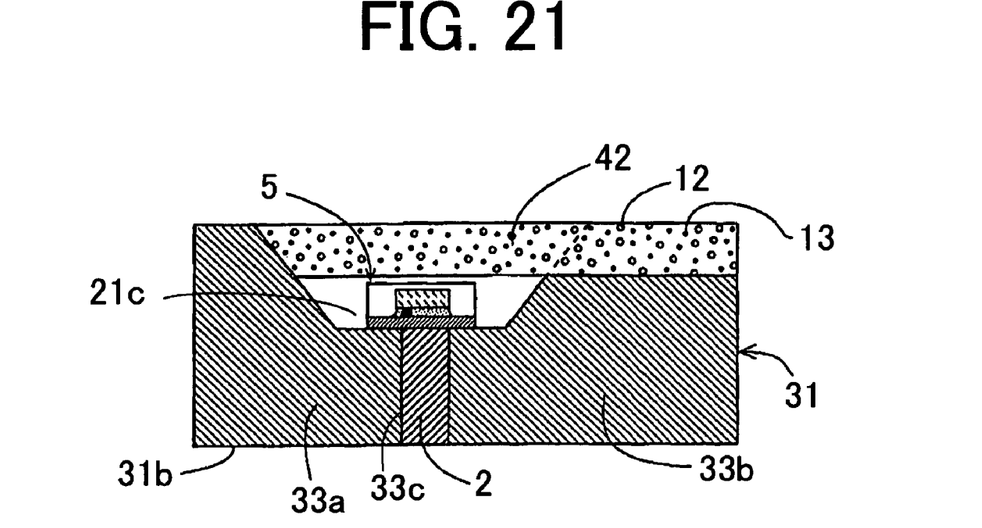
FIG. 21 is a sectional view of the device taken along a line A—A of FIG. 20.

FIG. 20 is a plan view showing a white light emitting device according to a fourth embodiment of the present invention, FIG. 21 is a sectional view of the device taken along a line A—A of FIG. 21. The white light emitting device 40 comprises a case 31 comprising a pair of metal cores 33a and 33b and a slit 33c between the metal cores 33a and 33b. The device 40 is characterized in that four grooves 31a are formed in the upper surfaces of the metal cores 33a, 33b radially extending from the recess 21c. On the other hand, four arms 42a are radially extending from a cover member 42, corresponding to the grooves 31a. The arms 42a are engaged in the grooves 31a and secured thereto.

Since the method for manufacturing the white light emitting device of the fourth embodiment is substantially same as that of the third embodiment, only different method is described hereinafter.

Figure 22A:
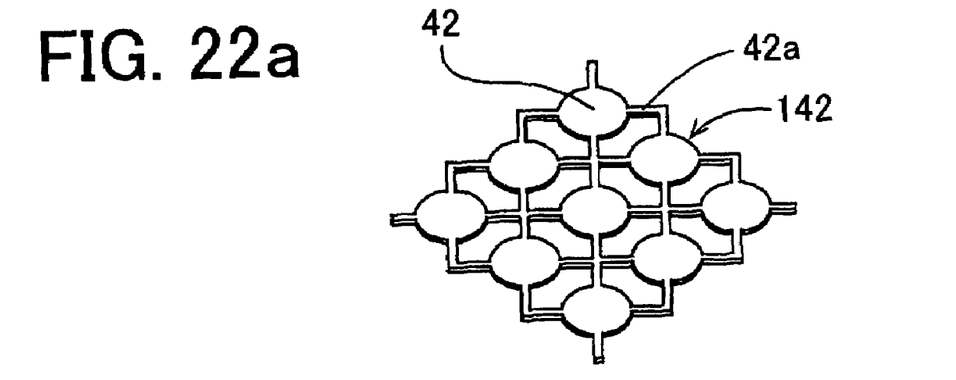
FIGS. 22a to 22c are perspective views for explaining a method of manufacturing a white light emitting device of a fourth embodiment.
Figure 22B:
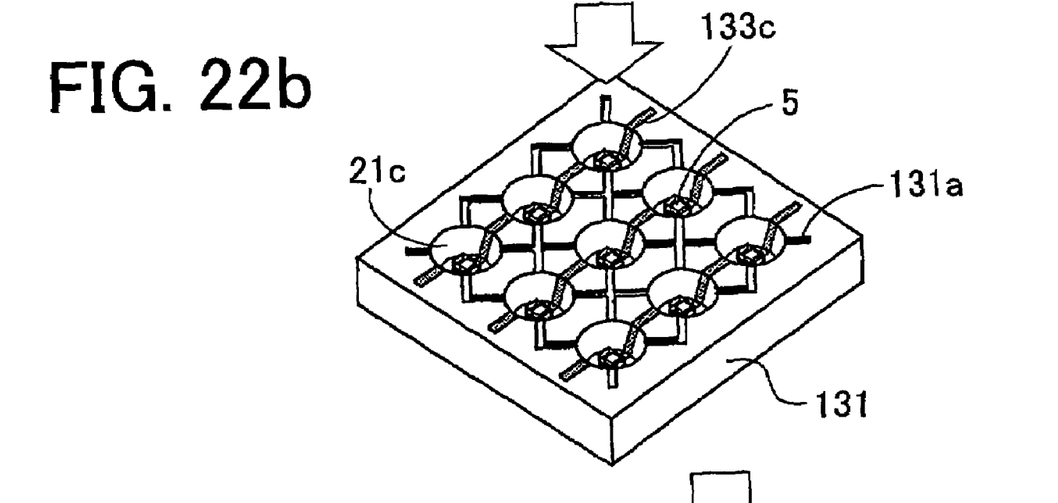
Figure 22C:
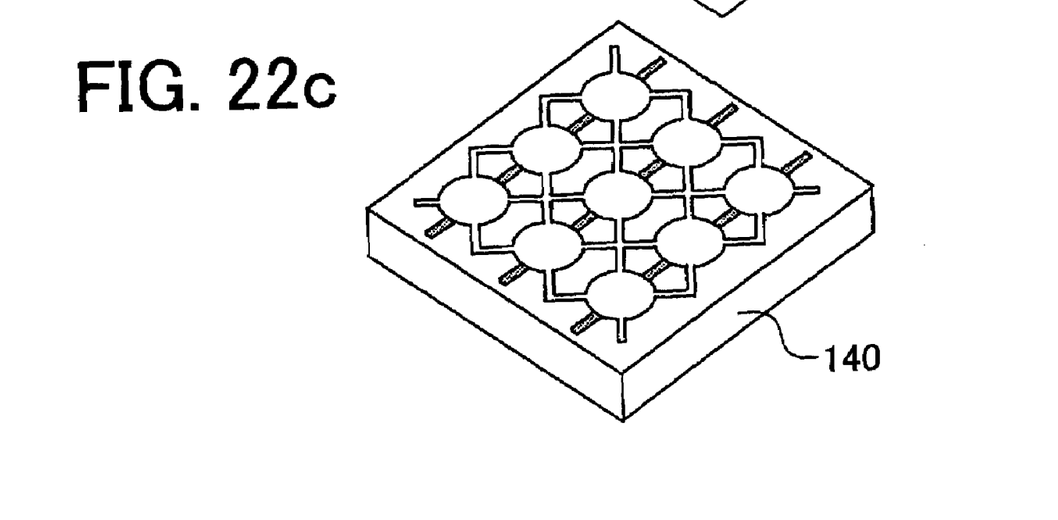

FIGS. 22a–22c are perspective views showing steps for manufacturing a light emitting device assembly. Referring to FIG. 22a, nine cover members 42 are assembled by connecting arms 42a of each cover member 42, thereby forming a cover member assembly 142.

On the other hand, in a case assembly 131 as shown in FIG. 22b, nine recesses 21c, grooves 131a and slits 133c are formed. The light emitting element unit 5 is mounted in each recess 21c.

As shown in FIG. 22c, the cover member assembly 142 is mounted on the case assembly 131. Thus a light emitting device assembly 140 is formed.

In accordance with the fourth embodiment, a plurality of cover members 42 having the same characteristics are assembled. Therefore, light emitting devices of same characteristics can be produced. Further, constructing steps are reduced.

Figure 23:
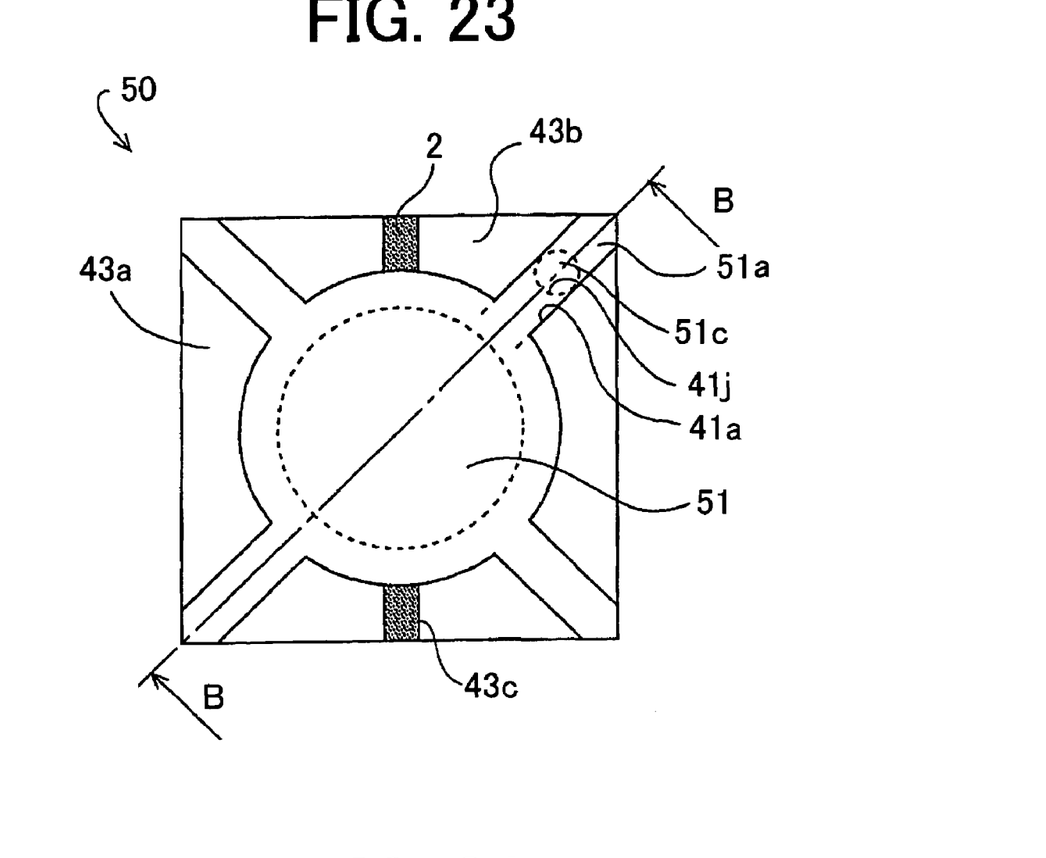
FIG. 23 is a plan view of a white light emitting device according to a fifth embodiment of the present invention.
Figure 24:
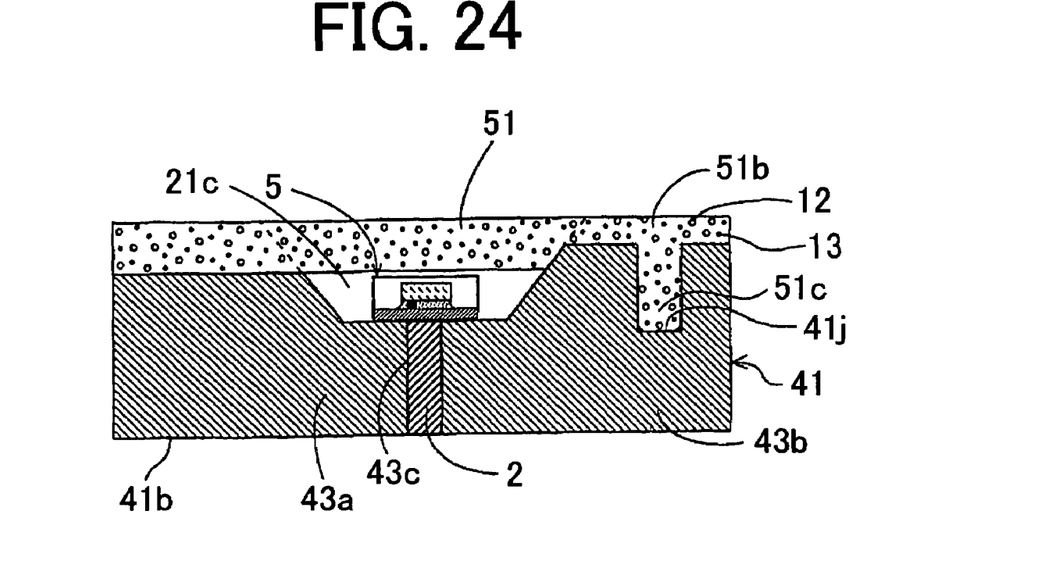
FIG. 24 is a sectional view of the device taken along a line B—B of FIG. 23.

FIG. 23 is a plan view of a white light emitting device according to a fifth embodiment of the present invention, FIG. 24 is a sectional view of the device taken along a line B—B of FIG. 23. The white light emitting device 50 comprises a case 41 comprising a pair of metal cores 43a and 43b and a slit 43c between the metal cores 43a and 43b. In the white light emitting device 50, four grooves 41a are formed in the upper surfaces of the metal cores 43a, 43b, radially extending from the recess 21c. In one of the grooves 41a, an engaging hole 41j is formed in the bottom of the groove. On the other hand, four arms 51a are radially extending from a cover member 51 and a projection 51c is formed on the underside of the arm 51a corresponding to the hole 41j of the groove 41a. The arms 51a are engaged in the grooves 41a and the projection 51c is engaged with hole 41j and secured thereto.

In accordance with the fifth embodiment, the cover member 51 is strongly fixed to the case 41 by the engagement of the projection 51c with the hole 41j.

In accordance with the present invention, there is provided the cover member in which the phosphor particles and the luminance reducing particles are mixed. Therefore the white light emitting device produces white light which satisfies both of the chromaticity and luminance in a desired range by selecting the amount of the phosphor and luminance reducing particles, thereby reducing the dispersion in characteristics.

Since the luminance reducing member is used, initial luminance can be set to a large value, so that the luminance is adjusted by reducing the luminance. Therefore, luminance can be adjusted in a wide range.

Since the cover member is made of the elastomer of silicon group, the phosphor particles and the luminance reducing particles are uniformly distributed in the cover member without depositing and biasing. Therefore, the LED device emits light uniform in chromaticity and luminance.

While the invention has been described in conjunction with preferred specific embodiment thereof, it will be understood that this description is intended to illustrate and not limit the scope of the invention, which is defined by the following claims.

What is claimed is:

1. A white light emitting device comprising:
   a case body having an empty recess, and inside wall of the recess having a light reflection surface;
   a blue light emitting element mounted on a bottom of the empty recess;
   the recess being formed into a cup shape having an inclined surface open in a light emitting direction;
   a cover member made of transparent resin and secured to the case body to enclose the empty recess so as to face the blue light emitting element;
   the cover member having an inclined peripheral wall in engagement with the inclined surface of the recess, and being spaced from the bottom of the recess on which the blue light emitting element is mounted;
   fluorescent material which has a function of converting wavelength of light emitted from the blue light emitting element to adjust chromaticity of the light, and luminance reducing material which has a function of adjusting the luminance of the light, which are mixed in the cover member,
   wherein the cover member has arms which are engaged with grooves in the case body, and
   wherein a projection is formed on an arm of the cover member, the projection being engaged with an engaging hole formed in a groove of the case body.

2. The white light emitting device according to claim 1 further comprising a cover member holding portion formed in the recess of the case body, the cover member being mounted on the cover member holding portion.

3. The white light emitting device according to claim 2 further comprising a shoulder formed in the recess of the case body for holding the cover member.

4. The white light emitting device according to claim 1 wherein the blue light emitting element is mounted on the bottom of the recess by face down bonding.

5. The white light emitting device according to claim 1 wherein the blue light emitting element is mounted on a substrate by face down bonding to form a light emitting unit, and the substrate is mounted on the bottom of the recess.

6. The white light emitting device according to claim 1 wherein the blue light emitting element comprises an LED of InGaN group.

7. The white light emitting device according to claim 1 wherein the fluorescent material is a fluorescent material of YAG group.

8. The white light emitting device according to claim 1 wherein the luminance reducing material is a black pigment.

9. A white light emitting device according to claim 1 wherein the case body comprises a pair of metal cores which are opposed to each other interposing an insulation member, the surface of each of the metal cores being coated with a metal plating having high reflectance.

10. The white light emitting device according to claim 9 wherein the metal core is made of a magnesium alloy, the surface of the metal core is coated with silver plating.

11. The white light emitting device according to claim 1 wherein the cover member is a part of a cover member assembly comprising a plurality of cover members which are connected by arms.

* * * * *